United States Patent [19]

Sato et al.

[11] Patent Number: 5,592,003
[45] Date of Patent: Jan. 7, 1997

[54] NONVOLATILE SEMICONDUCTOR MEMORY AND METHOD OF REWRITING DATA THERETO

[75] Inventors: Yasuo Sato; Kikuzo Sawada, both of Tokyo, Japan

[73] Assignee: Nippon Steel Corporation, Tokyo, Japan

[21] Appl. No.: 390,160

[22] Filed: Feb. 17, 1995

Related U.S. Application Data

[63] Continuation of Ser. No. 173,080, Dec. 27, 1993, abandoned.

[30] Foreign Application Priority Data

Dec. 28, 1992 [JP] Japan .................... 4-360028
Dec. 28, 1992 [JP] Japan .................... 4-360029

[51] Int. Cl.$^6$ ............................................. H01L 29/788
[52] U.S. Cl. ...................................... 257/322; 257/316
[58] Field of Search ............................ 257/315, 316, 257/322, 314

[56] References Cited

U.S. PATENT DOCUMENTS

| | | | |
|---|---|---|---|
| 4,004,159 | 1/1977 | Rai et al. | 257/316 |
| 4,016,588 | 4/1977 | Ohya et al. | 257/322 |
| 4,878,199 | 10/1989 | Mizutani | 257/316 |
| 4,912,676 | 3/1990 | Paterson et al. | 257/316 |
| 4,972,371 | 11/1990 | Komori et al. | 257/322 |
| 5,216,270 | 6/1993 | Kaya et al. | 257/316 |
| 5,243,559 | 9/1993 | Murai | 257/314 |
| 5,274,588 | 12/1993 | Manzur et al. | 365/185 |
| 5,300,802 | 4/1994 | Komori et al. | 257/322 |
| 5,341,342 | 8/1994 | Brahmbhatt | 257/314 |
| 5,349,220 | 9/1994 | Hong | 257/316 |
| 5,394,002 | 2/1995 | Peterson | 257/315 |
| 5,491,656 | 2/1996 | Sawada | 365/185.29 |

FOREIGN PATENT DOCUMENTS

| | | | |
|---|---|---|---|
| 55-91177 | 7/1980 | Japan | 257/316 |
| 61-127179 | 6/1986 | Japan . | |
| 1-77160 | 3/1989 | Japan | 257/315 |
| 4-229655 | 8/1992 | Japan | 257/315 |
| 4-211178 | 8/1992 | Japan | 257/316 |

OTHER PUBLICATIONS

Tetsuya Iizuka et al. under the supervision of Takuo Sugano: Design of a CMOS Super LSI, Baihukan, Apr. 1989, pp. 172–173.

Yashushi Terada, Flash Memory Technology and Its Future, The Institute of Electronics, Information and Communication Engineers, ICD 91–134, 1991.

T. Tanaka et al., Flash Memory with Negative Voltage Scheme, The Institute of Electronics, Information and Communication Engineers, ICD 91–135, 1991.

"2 Bet/Cell EEPROM Cell Using Band–to–Band Tunneling for Data Read–Out," IBM Technical Disclosure Bulletin, vol. 35, No. 4B, Sep. 1992, pp. 136–140.

Kume et al., "A 1.28αm$^2$ Contactless Memory Cell Technology for a 3V–Only 64–Mbit EEPROM," IEDM, Dec. 22, 1992, pp. 991–993.

*Primary Examiner*—Jerome Jackson
*Assistant Examiner*—Courtney A. Bowers
*Attorney, Agent, or Firm*—Pollock, Vande Sande & Priddy

[57] ABSTRACT

The promotion of reduction of the power source voltage for use in a nonvolatile semiconductor memory is attained by using a method wherein memory cells each of which includes a control gate having a floating gate above a channel region, and a source constituted by an N-type impurity diffusion layer enclosed with a high impurity concentrated P-type diffusion layer containing impurities the impurity concentration of which is higher than that of a P-type well are formed in double wells made up of an N-type well and the P-type well which are formed in a P-type silicon substrate, the electric potentials at the N-type well and the P-type well are controlled independently to each other to write data to the memory cell by utilizing the tunnel phenomenon, the electrical potential at the P-type well is made negative, and under this condition, a relatively low positive voltage and a high voltage are respectively applied to the control gate and the source and the hot electrons generated in the vicinity of the source are injected into the floating gate through the channel region by utilizing the tunnel phenomenon to erase the information stored in the memory cell.

1 Claim, 13 Drawing Sheets

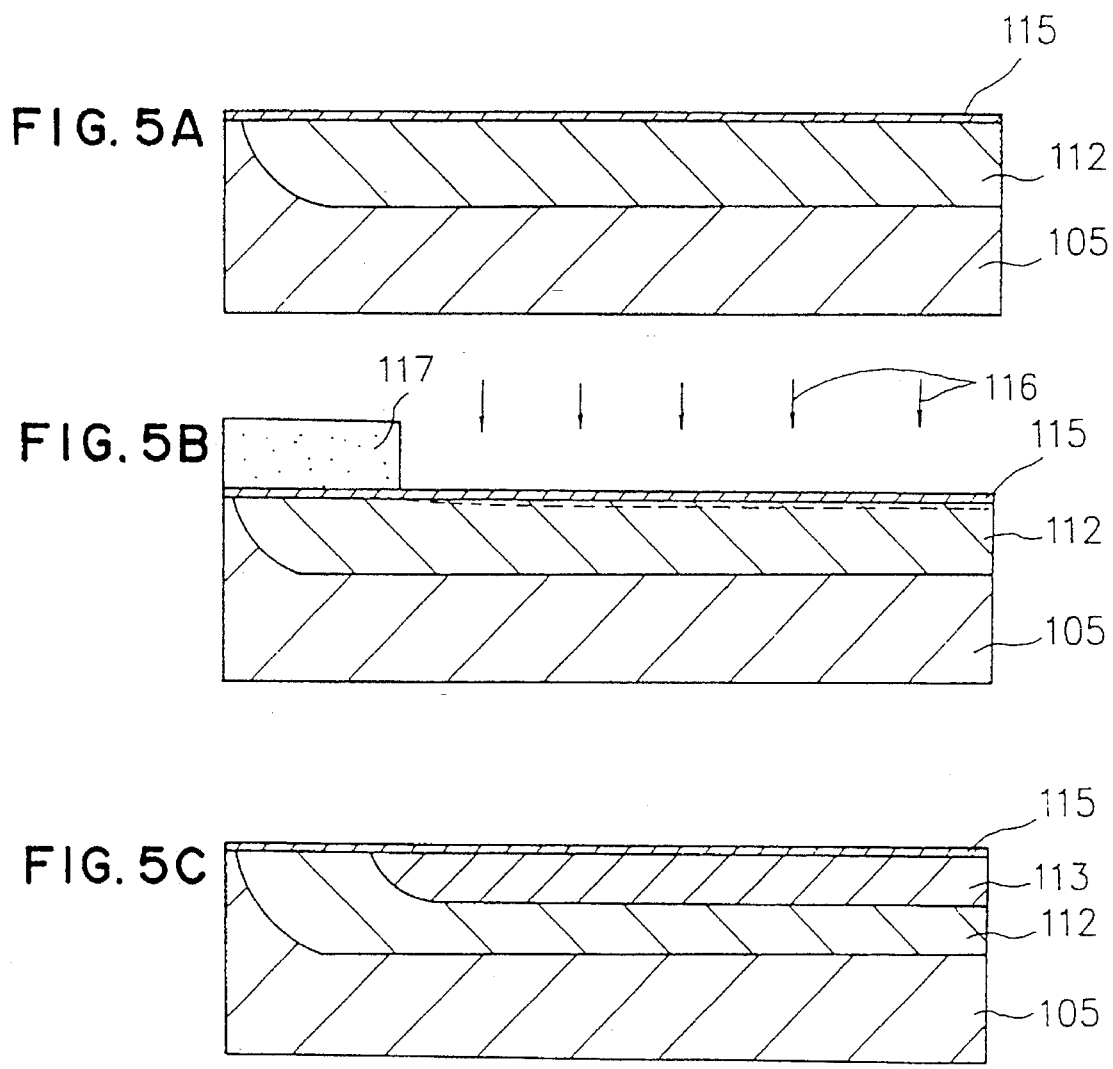

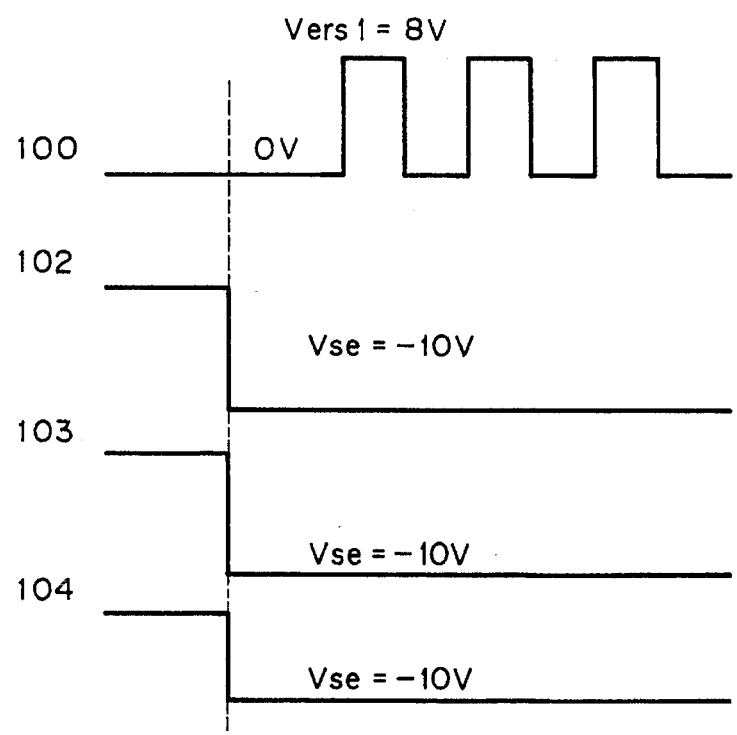
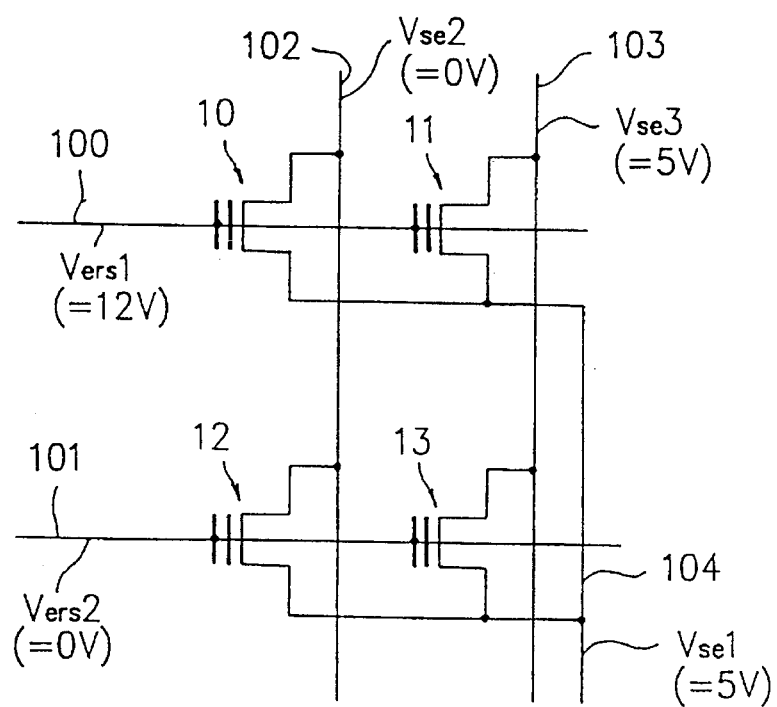

NONVOLATILE SEMICONDUCTOR MEMORY AND METHOD OF REWRITING DATA THERETO

This application is a continuation of Ser. No. 08/173,080 filed on Dec. 27, 1993, now abandoned.

BACKGROUND OF THE INVENTION

1. Field of the Invention

The present invention relates to an electrically erasable nonvolatile semiconductor memory such as EEPROM (Electrically Erasable Programmable Read Only Memory) and a method of rewriting data thereto.

2. Description of the Related Art

A large number of memory elements of an electrically erasable nonvolatile semiconductor memory have been proposed since the early 1980s. The typical ones are EEPROM memory cells each having a floating gate as an electric charge holding layer as described in the following articles.

Article (1): JP-A-61-127179 (based on U.S. patent application Nos. 673946 and 841121) entitled "ELECTRICALLY PROGRAMMED MEMORY UNIT OF A SINGLE TRANSISTOR AND A METHOD OF MANUFACTURING THE SAME", issued to Chang Thomas et al.

Article (2): "DESIGN OF A CMOS SUPER LSI" compiled under the supervision of Takuo Sugano, 1989, pp. 172 to 173.

Article (3): Yasushi Terada "Flash Memory Technology and Its Future", The Institute of Electronics, Information And Communication Engineers, ICD91-134.

Article (4): T. Tanaka et al. "FLASH MEMORY WITH NEGATIVE VOLTAGE SCHEME", The Institute of Electronics, Information And Communication Engineers, ICD91-135.

The EEPROM memory cell employing the floating gate includes, but is not limited to: a crystalline semiconductor silicon substrate of one conductivity type; source and drain diffusion layers which are formed in such a way that the surface of the semiconductor substrate is doped with the impurities of a conductivity type opposite to the conductivity type of the impurities contained in the semiconductor substrate (for example, in the case of a P-type semiconductor substrate doped with boron as the impurities, the source and drain diffusion layers are N-type layers doped with arsenic or phosphorous); a channel region, between the source and drain diffusion layer, through which the minority carriers are to be caused to flow; a thin oxide film provided on the channel region; a floating gate which is made of polycrystalline silicon and is provided on the thin oxide film; and a control gate which is made of polycrystalline silicon and is provided above the floating gate through a thin insulating film.

The principle of the operation of the EEPROM memory cell employing the floating gate is as follows. The electric charges (electrons or positive holes) are injected into the floating gate which is enclosed with the insulating films, thereby to be electrically isolated to be accumulated therein, whereby the threshold voltage of the memory cell is changed and the difference between the threshold voltage before the change and the threshold voltage after the change is utilized as the storage information.

FIGS. 15 and 16 show an example of a structure of the prior art EEPROM memory cell employing the floating gate (this structure is described in the Articles (1) and (2)).

In the structure of this example, one N-channel enhancement MOS transistor (a transistor 20, 21, 22 or 23 in FIG. 15) and one memory cell (a memory cell 24, 25, 26 or 27 in FIG. 15) having a floating gate are required for the data of 1 bit to be stored. Therefore, in the structure shown FIG. 15, the data of 4 bits can be stored.

In FIG. 15, the reference numerals 200 and 201 designate word lines. The word line 200 is connected to a gate of an N-channel enhancement MOS transistor 18 for selecting a byte and gates of the MOS transistors 20 and 21, respectively. On the other hand, the word line 201 is connected to a gate of an N-channel enhancement MOS transistor 19 for selecting a byte and gates of the MOS transistors 22 and 23, respectively.

In FIG. 15, the reference numerals 203 and 204 designate bit lines. The bit line 203 is connected to drains of the MOS transistors 20 and 22, and the bit line 204 is connected to drains of the MOS transistors 21 and 23.

In addition, the reference numeral 202 designates a sense line which is connected to drains of the MOS transistors 18 and 19.

Further, a source of the MOS transistor 18 is connected to a control gate 206 of the memory cells 24 and 25 (the control gate made of polycrystalline silicon is normally formed integrally with the connection line, and so forth on), and a source of the MOS transistor 19 is connected to a control gate 207 of the memory cells 26 and 27.

Further, a source of the MOS transistor 20 and a drain of the memory cell 24, a source of the MOS transistor 21 and a drain of the memory cell 25, a source of the MOS transistor 22 and a drain of the memory cell 26, and a source of the MOS transistor 23 and a drain of the memory cell 27 are formed of common N-type impurity diffusion layers 208, 209, 210 and 211, respectively. Those source and drain are electrically connected to each other.

The reference numeral 205 designates a source line which is connected to sources of the memory cells 24 to 27.

Incidentally, the threshold voltage of each of the MOS transistors 18 to 23 is 1 V for example.

FIG. 16 is a cross sectional view taken along the line B—B of FIG. 15. In the figure, the reference numeral 220 designates a P-type silicon substrate, the reference numerals 205', 208 and 203' designate N-type impurity diffusion layers and the reference numerals 223 and 224 designate a silicon oxide film formed by the thermal oxidation (a gate oxide film). In addition, a part 225 of the silicon thermal oxide film 224 has a thickness which is smaller than those of the remaining part of the silicon thermal oxide film 224 and the silicon thermal oxide film 223 (for example, in the case where the thickness of the remaining part of the silicon thermal oxide film 224 and the silicon thermal oxide film 223 is 50 nm, the thickness of the part 225 is 10 nm).

In addition, the reference numeral 226 designates a floating gate made of polycrystalline silicon for example, the reference numeral 206 designates a control gate made of polycrystalline silicon for example, and the reference numeral 227 designates an insulating film (for example, a thermal oxide film having a thickness of about 25 nm) between the floating gate 226 and the control gate 206.

Further, the reference numeral 200 designates a gate (formed integrally with the word line 200 of FIG. 15) of the MOS transistor 20 which is made of polycrystalline silicon for example, the reference numeral 228 designates an insulating layer, and the reference numeral 203 designates a bit line which is made of aluminium as the main material. In addition, the reference numeral 229 designates a contact hole through which the bit line 203 is connected to an N-type impurity diffusion layer 203' constituting the drain of the MOS transistor 20. Incidentally, the floating gate 226 is entirely enclosed within the periphery thereof by the insulating films and is electrically isolated from other conductive parts.

FIG. 17 is a circuit diagram showing an electrical equivalent circuit of each of the memory cells shown in FIGS. 15 and 16. In the figure, the reference numeral 206 designates the control gate to which a voltage Vg is to be applied, the reference numeral 208 designates the drain to which a voltage Vd is to be applied, the reference numeral 205' designates the source to which a voltage Vs is to be applied, and the reference numeral 220 designates the semiconductor substrate to which a voltage Vsub is to be applied. The insulating films 224 and 227 of FIG. 16 can be expressed in the form of electrical capacitors, respectively. Then, it is assumed that Cip is representative of a capacitance between the floating gate 226 and the control gate 206, Cd a capacitance between the floating gate 226 and the drain 208, Cs a capacitance between the floating gate 226 and the source 205' and Csub a capacitance between the floating gate 226 and the semiconductor substrate 220. Then, if an electrical potential at the floating gate 226 is assumed to be Vf, the following expression is established on the basis of the principle of charge conservation.

$$Cip(Vg - Vf) = Cs(Vf - Vs) + Csub(Vf - Vsub) + Cd(Vf - Vd) \quad (1)$$

When the relationship of Vs=Vsub=Vd=0 V is established in the expression (1), the following expression is obtained.

$$Vf = Vg \cdot Rp$$

where $Rp = Cip/(Cip + Cd + Csub + Cs)$ (2)

Rp is called "the coupling ratio" and is generally in the range of 0.55 to 0.7.

Next, the description will hereinbelow be given with respect to the operation of the rewriting and reading of the data to and from EEPROM having the above-mentioned structure.

In FIG. 15, in the case where the data is written to the memory cell 24, for example, the electric potentials on the word line 200, the sense line 202 and the bit line 203 are respectively made 20 V, 0 V and 20 V, and the source line 205 is opened, whereby the MOS transistors 18, 20 and 21 are turned on, and the electric potential at the control gate becomes 0 V and the electric potential at the drain 208 of the memory cell 24 becomes about 18 V (the voltage value which is obtained by subtracting the threshold voltage of the MOS transistor 20 from 20 V (including the substrate effect)). As a result, the voltage of about 7 V is induced in the floating gate of the memory cell 24 (refer to FIG. 16). At this time, since the part 225 of the silicon thermal oxide film 224 shown in FIG. 16 has the thickness of 10 nm, due to the difference in electric potential between the floating gate 226 and the drain 208, the Fowler-Nordheim tunnel current (the tunnel current conforming to the Fowler-Nordheim expression (hereinafter, referred to as "the F-N tunnel current" for short, when applicable)) is caused to flow through the part 225. This F-N tunnel current is, in general, caused to flow when an electric field, which is equal to or higher than 10 MV/cm, is applied to a very thin oxide film (having a thickness equal to or smaller than 10 nm). Then, by flowing of the F-N tunnel current, the positive holes are injected from the drain 208 into the floating gate 226 so that the threshold voltage of the memory cell 24 is lowered (for example, if the initial threshold voltage of the memory cell 24 is 2 V, the threshold voltage after the writing operation will be lowered to −2 to −3 V). At this time, the voltages on the word lines other than the word line 200 and the bit lines other than the bit line 203, that is in the figure, the voltages on the word line 201 and the bit line 204 are made 0 V, whereby a high voltage is not applied to the memory cells other than the memory cell 24. As a result, the writing of the data is now performed.

In the case where the data stored in the memory cell 24 is erased, for example, 20 V is applied to the word line 200, 20 V to the sense line 202 and 0 V to the bit line 203, then the voltage at the control gate 206 becomes about 18 V and the voltage at the drain 208 becomes 0 V. As a result, the voltage of about 11 V is induced in the floating gate 226 of the memory cell 24, and the F-N tunnel current is caused to flow through the part 225, and thus the electrons are injected into the floating gate 226, so that the threshold voltage of the memory cell 24 is elevated (for example in the range of 6 to 7 V). At this time, the voltage applied to the word lines other than the word line 200, e.g., the word line 201 is made 0 V, whereby the control gate 207 is enabled and thus the data stored in the memory cells 26 and 27 is not erased. But, in this case, since 0 V is applied to all the bit lines, the data stored in all the memory cells connected to the same node as that of the control gate 206, for example, the memory cell 25, are erased.

In the case where the data stored in the memory cell 24 is read out, for example, 5 V, 3 V and 2 V are respectively applied to the word line 200, the sense line 202 and the bit line 203, whereby the MOS transistors 18 and 20 are turned on, the voltage at the drain 208 of the memory cell 24 goes to 2 V, and the voltage at the control gate 206 goes to 5 V. At this time, in the case where the threshold voltage of the memory cell 24 is higher, that is, in the range of 6 to 7 V, this memory cell 24 is in the off state and thus no current flows between the drain and the source. On the other hand, in the case where the threshold voltage of the memory cell 24 is lower, that is, in the range of −2 to −3 V, this memory cell 24 is in the on state and thus the current is caused to flow between the drain and the source. The existence (or the magnitude) of the current is detected, whereby the reading of the data stored in the memory cell is performed.

FIGS. 18 and 19 show another example of a structure of the prior art EEPROM employing the floating gate (this structure is described in the Articles (1), (3) and (4)).

In FIG. 18, the reference numerals 30, 31, 32 and 33 designate memory cells, the reference numerals 300 and 301 designate word lines, and the reference numerals 302 and 303 designate bit lines. Then, the word line 300 is connected to the control gate of the memory cells 30 and 31, and the word line 301 is connected to the control gate of the memory cells 32 and 33. In addition, the bit line 302 is connected to the drains of the memory cells 30 and 32, and the bit line 303 is connected to the drains of the memory cells 31 and 33. Further, the reference numeral 304 designates a source line which is connected to the sources of the memory cells 30 to 33.

FIG. 19 shows a cross sectional view taken along the line C—C of FIG. 18. In the figure, the reference numeral 305 designates a P-type silicon substrate, the reference numerals 302' and 304' designate N-type impurity diffusion layers, and the reference numeral 306 designates a thin silicon thermal oxide film (having a thickness of 10 nm for example) (the gate oxide film). In addition, the reference numeral 309 designates a floating gate which is made of polycrystalline silicon for example, the reference numeral 300 designates a control gate which is made, for example, of polycrystalline silicon (formed integrally with the word line 300 of FIG. 18), and the reference numeral 307 designates an insulating film (an insulating film which has a thickness of 25 nm and is made up of an oxide film and a nitride film) provided between the floating gate 309 and the control gate 300. Further, the reference numeral 310 designates an insulating layer, and the reference numeral 302 designates a bit line which is made of aluminium as the main material. Moreover, the reference numeral 308 designates a contact hole through which the bit line 302 is connected to the N-type impurity diffusion layer 302'.

Next, the description will hereinbelow be given with respect to the rewriting and the reading of the data to and from EEPROM having the above-mentioned structure.

Now, it is assumed that under the condition in which no electric charge is injected into the floating gate of each memory cell, the threshold voltage of each of the memory cells is 2 V, for example.

In the case where the data is written to the memory cell 30, the electric potentials on the word line 300, the word line 301, the bit line 302, the bit line 303 and the source line 304 are respectively made 12 V, 0 V, 5 V, 0 V and 0 V. At this time, if the coupling ratio Rp of the memory cells is assumed to be 0.6 V, the voltage of about 7 V is induced in the floating gate 309 of FIG. 19. As a result, a channel layer of electrons is formed between the drain 302' and the source 304' of the memory cell. In addition, due to the high gate voltage and the high drain voltage, the hot electrons are generated in the high electric field region in the vicinity of the drain 302' and then the hot electrons thus generated surmount a potential barrier between the silicon and the gate oxide film to be injected into the floating gate 309. This phenomenon is called "the channel hot electron injection" (hereinafter, referred to as "the CHE injection" for short, when applicable). As a result of generation of this CHE injection, the threshold voltage of the memory cell 30 of FIG. 18 is elevated up to 6 to 8 V for example so that the writing operation is performed. At this time, prior to the generation of the CHE injection, a current of 30 µA to 1 mA is caused to flow through the portion between the drain and the source of the memory cell 30. Further, since both the word line 301 and the bit line 303 are at 0 V, no data is written to the memory cells 31 to 33.

In the case where the data stored in the memory cell 30 is erased, for example, the electric potential on the word line 300 is made −9 V, the electric potential on the word line 301 is made 0 V, both the bit lines 302 and 303 are released, and the electric potential on the source line 304 is made 5 V. As a result, the voltage of about −7 V is induced in the floating gate of the memory cell 30, and thus the electrons are extracted in the form of the F-N tunnel current from the floating gate 309 into the source 304' via the gate oxide film 306. Then, the quantity of extracted electrons is suitably adjusted by a control circuit, whereby the threshold voltage of the memory cell 30 is lowered to 2 to 3 V. Incidentally, in this example as well, all the memory cells which have the control gate common to the memory cell 30 through the word line 300, for example, the memory cell 31 is erased with the data stored therein. Since the word line 301 is at 0 V, the data stored in the memory cells 32 and 33 is not erased.

In the case where the data stored in the memory cell 30 is read out, for example, the electric potentials on the word line 300, the word line 301, the bit line 302, the bit line 303, and the source line 304 are respectively made 5 V, 0 V, 1 V, 0 V and 0 V. In this connection, when the threshold voltage of the memory cell 30 is high (for example, in the range of 6 to 8 V), no current is caused to flow through the portion between the drain and the source of the memory cell 30. However, when the threshold voltage of the memory cell 30 is low (for example, in the range of 2 to 3 V), a current is caused to flow through the portion between the drain and the source of the memory cell 30.

In the first prior art shown in FIGS. 15 and 16, the writing of the data to the memory cell is performed by the injection of the electric charges utilizing the F-N tunnel current. Therefore, there is provided the advantage that in the writing operation, only the relative small current (for example, a current of 10 to 1000 pA per memory cell) is required for the memory cell.

However, in the first prior art, since the writing of the data is performed selectively among the cell array, the separating transistors, such as the MOS transistors 20 to 23 of FIG. 15, are required for separating the memory cells from one another. That is, in the case where those separating MOS transistors 20 to 23 are not provided, if the data is written to the memory cell 24 for example by the above-mentioned method, at the same time, the same data will also be written to all the memory cells connected to the bit line 203, for example, the memory cell 26. Thus, if one separating transistor is provided for 1 bit, as the area occupied by such separating transistors, the area of about 80 to 150 µm² for example will be required. Therefore, there arises the problem that the promotion of the large scale integration of the cell array is hindered.

On the other hand, in the second prior art shown in FIGS. 18 and 19, there is provided the advantage that the separating transistor as in the first prior art is not required. On the other hand, since the CHE injection from the vicinity of the drain is utilized during the writing operation, there is provided the disadvantage that the large current needs to be caused to flow through the corresponding part of the memory cell. That is, in the case of the writing operation utilizing the F-N tunnel current, the quantity of necessary current is small. Therefore, even when the semiconductor memory is operated by using the power source voltage of 3 V for example, the booster circuit such as a charge pump circuit is provided in the integrated circuit, whereby the semiconductor memory can be operated by using the single power source voltage. On the other hand, in the case where the writing of the data is performed by utilizing the CHE injection from the vicinity of the drain, there is a limit to the reduction of the drain voltage because the hot electrons need to be generated in the corresponding part. That is, although the drain voltage of 6 to 7 V is required for the integrated circuit having a minimum processing size at a 0.8 µm level for example, even if the minimum processing size is reduced to 0.5 µm level, the drain voltage can be lowered to no more than 5 V. Therefore, it is substantially impossible to operate the semi-conductor memory by using the reduced single power source voltage.

In addition, even if the drain voltage in the writing operation utilizing the CHE injection from the vicinity of the drain can be lowered to about 3 V, in this case, there arises the problem that the malwriting of the data due to the drain voltage in the reading operation occurs easier. That is, in the case where the writing of the data is performed by utilizing the CHE injection from the vicinity of the drain, if the difference between the drain voltage in the writing operation and that in the reading operation is small, the problem of the malwriting easily occurs due to the drain voltage in the reading operation so that the reliability of the memory is degraded.

Thus, in the case of the prior art writing method utilizing the CHE injection from the vicinity of the drain, there arises the problem that it is difficult to promote the reduction of the power source voltage, as compared with the writing method utilizing the F-N tunnel current.

SUMMARY OF THE INVENTION

It is therefore an object of the present invention to provide a method of rewriting data to a nonvolatile semiconductor memory, such as EEPROM, which requires no separating transistor and can be operated by using a reduced single power source voltage, and a nonvolatile semiconductor memory which is suitable for carrying out the same.

In order to solve the above-mentioned problems, according to the present invention, an electrically erasable nonvolatile semiconductor memory, which includes a semiconductor substrate portion of a first conductivity type, and a plurality of memory cells arranged in a matrix, each of the memory cells having a source and a drain, a channel region formed between the source and drain, an electric charge holding layer provided above the channel region, and a control gate provided above the electric charge holding layer, may provide for an impurity diffusion layer of a second conductivity type constituting the source of each of the memory cells to be at least locally in contact with a high impurity concentrated diffusion layer containing impurities of the first conductivity type the impurity concentration of which is higher than that of the semiconductor substrate portion.

In the present invention, preferably, the impurity diffusion layer of the second conductivity type constituting the source is enclosed by the high impurity concentrated diffusion layer.

In addition, the nonvolatile semiconductor memory according to the present invention may provide that each of the memory cells is formed within a first well of the first conductivity type, the first well is formed within a second well of the second conductivity type, the second well is formed in the semiconductor substrate of the first conductivity type, and the electrical connection to the first well is performed independently of that to the second well.

In the present invention, the electric charge holding layer is preferably a floating gate.

In addition, in the present invention, the impurity concentration of the first well is preferably higher than that of the semiconductor substrate.

Further, in the method of rewriting data to the nonvolatile semiconductor memory according to the present invention, each of the memory cells has both a writing level and an erasing level in accordance with the change in the threshold voltage due to the difference in the quantity of electric charges accumulated in the electric charge holding layer. In the case where the data is written to the selected memory cell out of the plurality of memory cells, a first voltage lower than the ground potential is applied to the control gate of the memory cell of interest; a second voltage higher than the ground potential is applied to the drain of the memory cell of interest; the negative electric charges are extracted from the electric charge holding layer of the memory cell of interest by utilizing the tunnel phenomenon due to the potential difference between the first and second voltages thereby to make the memory cell with the writing level; a third voltage which is lower than the second voltage and by which the tunnel phenomenon may not be caused due to the potential difference between the first and third voltages is applied to the drain of at least one first non-selected memory cell having the control gate electrically connected to the control gate of the selected memory cell; and a fourth voltage, which is higher than the first voltage and by which the tunnel phenomenon may not be caused due to the potential difference between the second and fourth voltages, is applied to the control gate of at least one second non-selected memory cell having the drain electrically connected to the drain of the selected memory cell.

In the present invention, preferably, in the case where the data stored in the memory cell selected out of the plurality of memory cells is erased, a fifth voltage is applied to the control gate of the memory cell of interest and also a sixth voltage higher than the ground potential is applied to the source of the memory cell of interest, and the hot electrons are injected from the channel region of the memory cell of interest into the electric charge holding layer of the memory cell of interest by the application of the fifth and sixth voltages thereby to make the memory cell of interest have the erasing level.

In addition, the sixth voltage lower than the fifth voltage is applied to both the source and drain of the memory cell of interest, and the negative electric charges are injected from the channel region into the electric charge holding layer of the memory cell of interest by utilizing the tunnel phenomenon, thereby to make the memory cell of interest have the erasing level.

Further, in the present invention, the sixth voltage is preferably lower than the ground potential.

In the present invention, in the case where the data is written to the memory cell of the non-volatile semiconductor memory such as EEPROM having the electric charge holding layer, the negative electric charges are extracted from the electric charge holding layer by utilizing the tunnel phenomenon. However, a difference between the present invention and the prior art is that the negative voltage is applied to the control gate of the selected memory cell, and the existence and non-existence of the tunnel phenomenon, that is the writing of the data is controlled by the levels of the voltage applied to the drain (for example, 5 V and 0 V). In addition, a voltage which is higher than the negative voltage but is lower than the threshold voltage of the memory cell in the state in which no electric charge is accumulated in the electric charge holding layer, for example, 0 V when the negative voltage is −8 V and the threshold voltage of the memory cell is 2 V is applied to the control gate of the non-selected memory cells each having the drain electrically connected to the drain of the selected memory cell, whereby the tunnel phenomenon is effectively prevented from occurring in the non-selected memory cell.

Further, in the case where the hot electrons are injected into the electric charge holding layer of the memory cell thereby to erase the data stored in that memory cell, in the present invention, the impurity diffusion layer constituting the source of the memory cell contacts the high impurity concentrated diffusion layer which has the same conductivity type as that of the semiconductor substrate portion and contains the impurities the impurity concentration of which is higher than that of the semiconductor substrate portion. Therefore, the efficiency of generation of the hot electrons in the vicinity of the source of the memory cell can be improved.

In this case, the impurity diffusion layer constituting the source of the memory cell is preferably enclosed with the high impurity concentrated diffusion layer. However, it is also effective that the impurity diffusion layer is only locally in contact with the high impurity concentrated diffusion layer.

In addition, in the nonvolatile semiconductor memory of the present invention, each of the memory cells is formed in the double wells formed in the semiconductor substrate, for example, in a P-type well which is formed in an N-type well formed in the P-type semi-conductor substrate, and also the electric potentials at the wells can be changed independently of each other. Therefore, the electric potential at the semiconductor substrate portion of the memory cells, that is, at the P-type well can be adjusted independently of those at the semiconductor substrate portion in the peripheral circuit portion.

Incidentally, in the present invention, by "the semiconductor substrate portion", it is meant, when the memory cells are formed in the semiconductor substrate, that semiconductor substrate, and, when the memory cells are formed in the double wells, the epitaxial layer or the like which is formed in the semiconductor substrate, the double wells, the epitaxial layer or the like.

In addition, "the tunnel phenomenon" is not limited only to the F-N tunnelling conforming to the Fowler-Nordheim expression. That is, it may also be other tunnel phenomena, for example, the direct tunnelling.

Further, "the electric charge holding layer" is not limited only to the floating gate. That is, by "the electric charge holding layer", it is meant generally the layer into which the electric charges can be injected and also which can accumulate the electric charges thus injected, including the insulating layer or the like made of the nitride for example in the trap type EEPROM memory cells.

BRIEF DESCRIPTION OF THE DRAWINGS

FIG. 5A is a cross sectional view useful in explaining a first step in an example of a method of forming double wells of a semiconductor memory of the present invention;

FIG. 5B is a cross sectional view useful in explaining a second step in an example of a method of forming double wells of a semiconductor memory of the present invention;

FIG. 5C is a cross sectional view useful in explaining a third step in an example of a method of forming double wells of a semiconductor memory of the present invention;

FIG. 11 shows a relationship between waveforms at several points in the circuit of FIG. 10.

FIG. 12 is a circuit diagram useful in explaining the combination of the applied voltages in a third example of a method of erasing data stored in the memory cell of FIG. 2;

DESCRIPTION OF THE PREFERRED EMBODIMENTS

The preferred embodiments of the present invention will hereinafter be described with reference to FIGS. 1 to 14.

Figure 1:
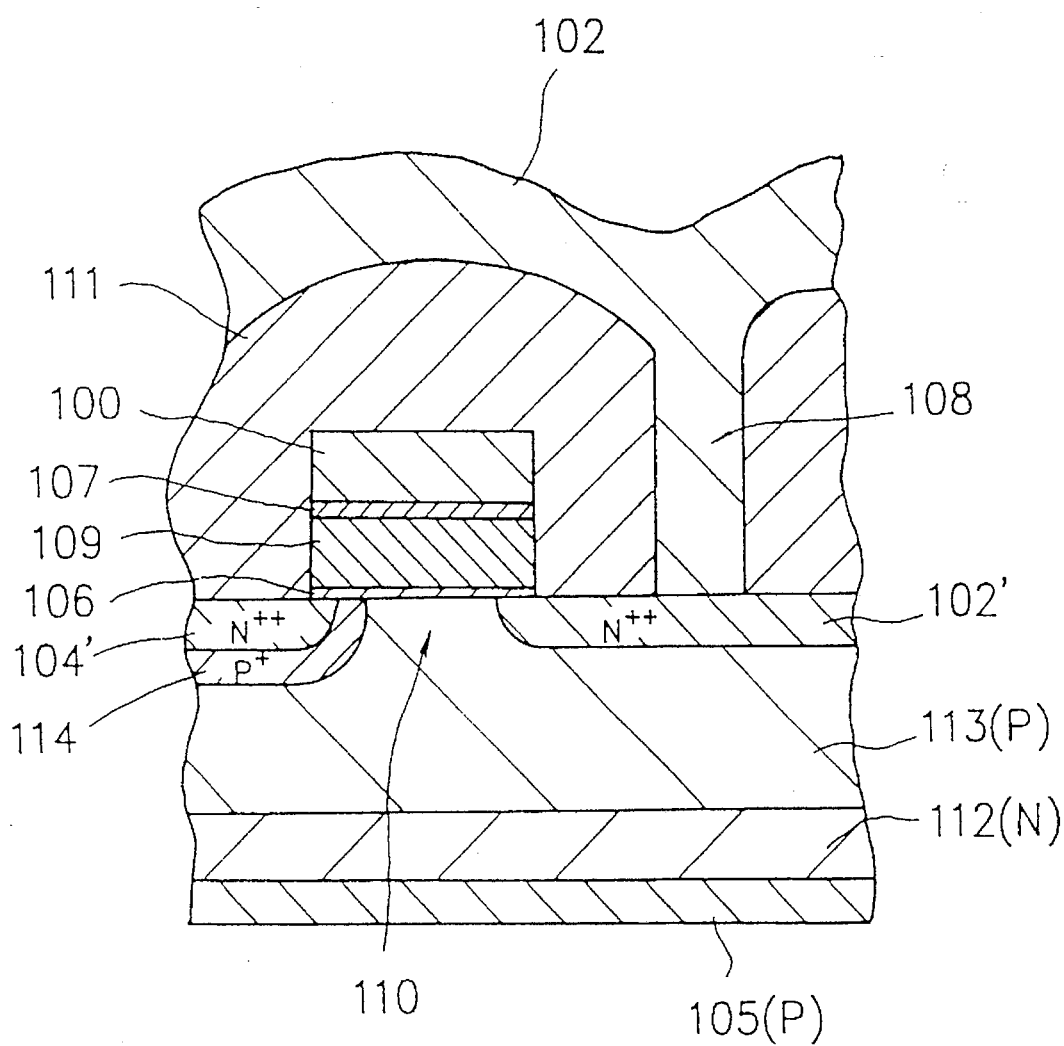
FIG. 1 is a schematic vertical cross sectional view taken along the line A—A of FIG. 2 and shows a structure of an EEPROM memory cell according to an embodiment of the present invention.
Figure 2:
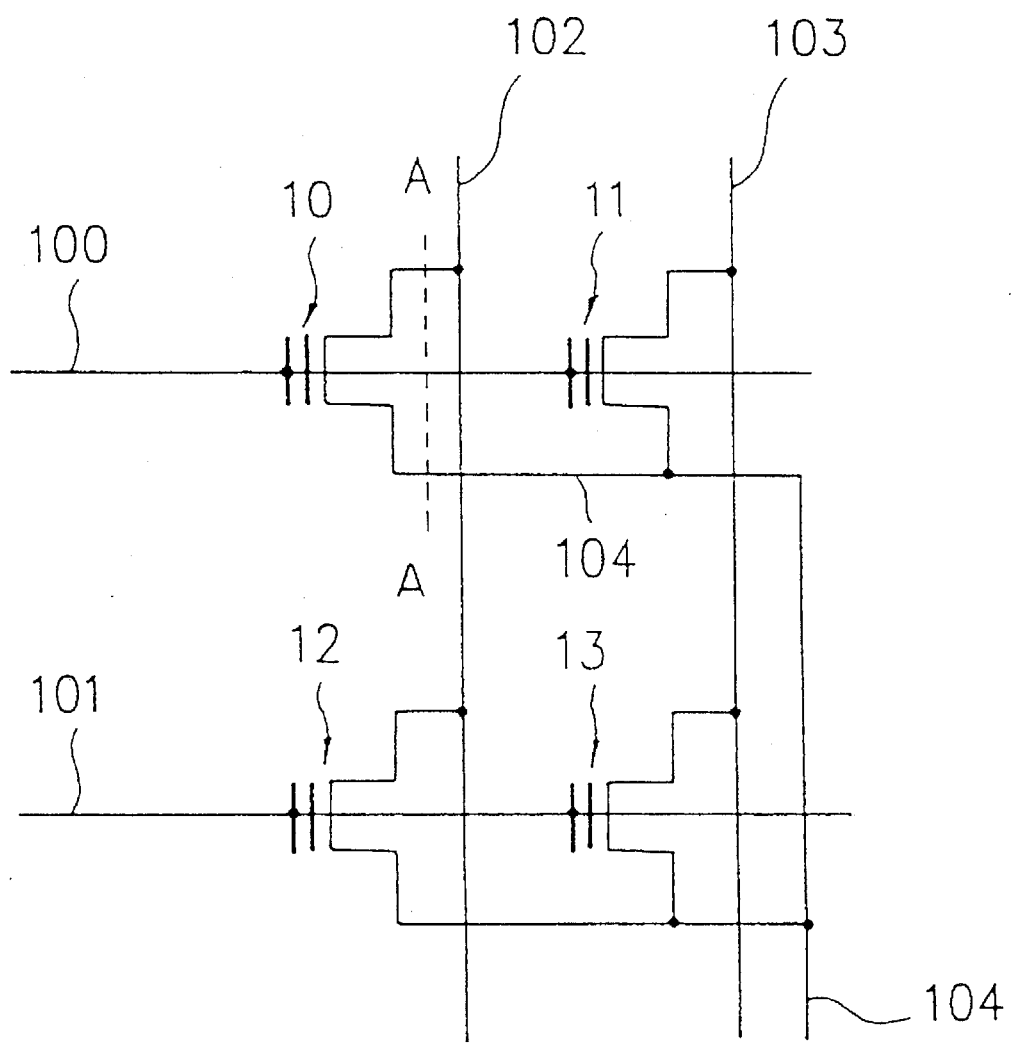
FIG. 2 is a circuit diagram showing the electrical connection between the memory cells typical one of which is shown in FIG. 1.

FIG. 2 is a connection diagram of an embodiment in which the present invention is applied to EEPROM. FIG. 1 is a schematic cross sectional view taken along the line A—A of FIG. 2.

In FIG. 2, the reference numerals 10, 11, 12 and 13 designate memory cells each having a floating gate, the reference numerals 100 and 101 designate word lines, the reference numerals 102 and 103 designate bit lines, and the reference numeral 104 designates a source line. In this connection, the word line 100 is connected to a control gate of the memory cells 10 and 11, the word line 101 is connected to a control gate of the memory cells 12 and 13. In addition, the bit line 102 is connected to drains of the memory cells 10 and 12, and the bit line 103 is connected to drains of the memory cells 11 and 13. Further, the source line 104 is connected to sources of the memory cells 10 to 13.

Figure 4:
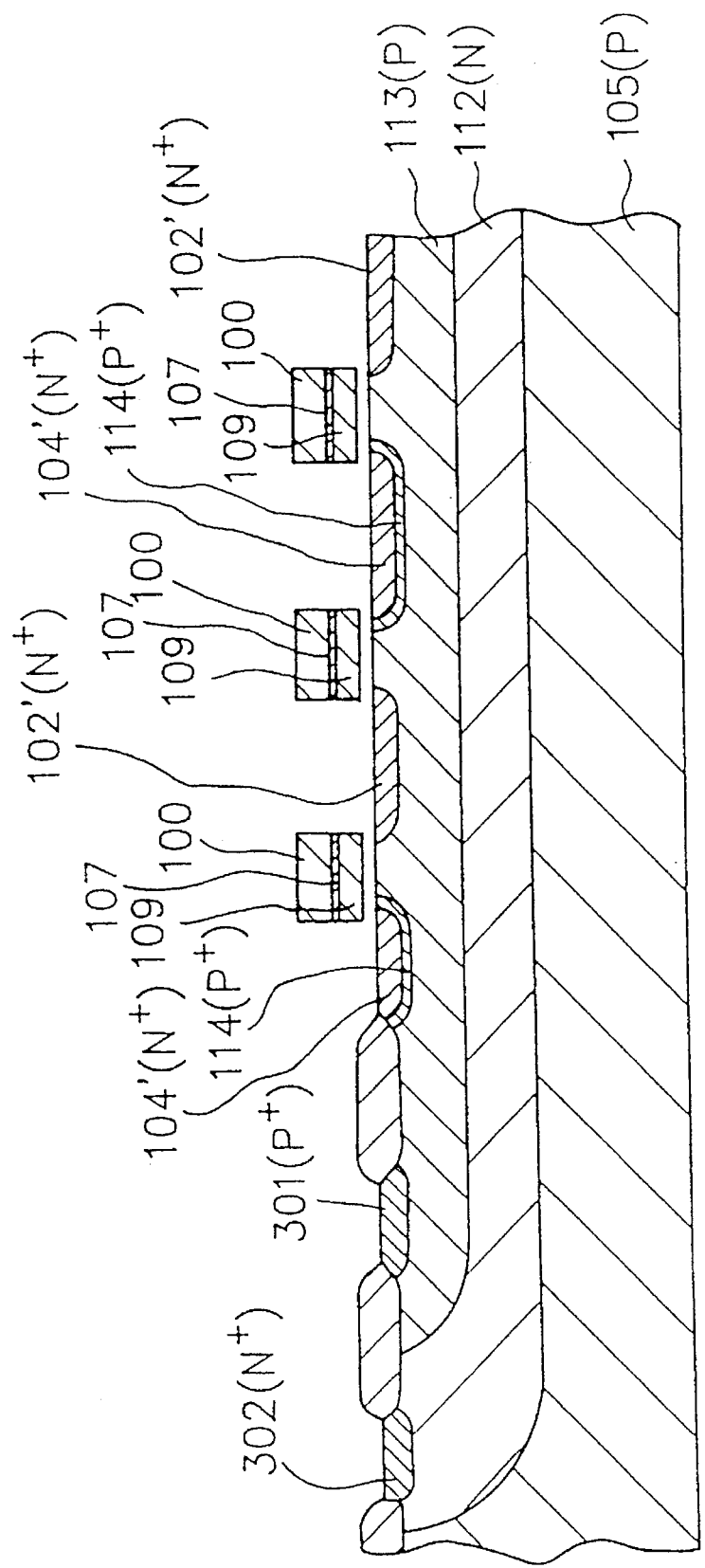
FIG. 4 is a schematic vertical cross sectional view showing a structure of the peripheral portion of a cell array of EEPROM according to the embodiment of the present invention.

In the present embodiment, as shown in FIGS. 1 and 4, an N-type well 112 is formed in a P-type silicon substrate 105, and a P-type well 113 is formed in the N-type well 112. In this connection, each of the memory cells is formed in the P-type well 113. The surface impurity concentration of the P-type well 113 is $1\times10^{17}$ cm$^{-3}$ for example.

As shown in FIG. 4, the P-type well 113 is formed so as to float in the N-type well 112. Further, in the peripheral portion of a cell array, a high impurity concentrated P-type diffusion layer 30 and a high impurity concentrated N-type diffusion layer 302 for fixing the electric potentials at the P-type well 113 and the N-type well 112 are respectively provided.

Each of the memory cells, for example, the memory cell 10 includes, as shown in FIG. 1, but is not limited to,: N-type impurity diffusion layers 104' and 102' constituting the source and the drain; a gate oxide film 106 with a thickness of about 10 nm which is formed by the thermal oxidation method; a floating gate 109 with a thickness of about 150 nm which is made of conductive polycrystalline silicon and is formed on the gate oxide film 106; an insulating film 107 with a thickness of about 25 nm which is formed on the floating gate 109 and is made up of an oxide film and a nitride film; and a control gate 100 with a thickness of about 250 nm which is made of conductive polycrystalline silicon and is formed on the insulating film 107. Incidentally, the control gate 100 is formed integrally with the word line 100 of FIG. 2.

In addition, in the present embodiment, as shown in FIGS. 1 and 4, the N-type impurity diffusion layer 104' constituting the source of the memory cell is enclosed by a P-type impurity diffusion layer 114 the impurity concentration of which is higher (for example, $1\times10^{18}$ cm$^{31}$) than that of the P-type well 113.

In FIG. 1, the reference numeral 110 designates a channel region a width of which is in the range of about 0.4 to about 1 μm. In addition, the reference numeral 111 designates an insulating layer, the reference numeral 102 designates a bit line which is made of aluminium as the main material, and the reference numeral 108 designates a contact hole through which the bit line 102 is connected to the N-type impurity diffusion layer 102' as the drain.

In the present embodiment, the threshold voltage of the memory cell when no electric charge is injected into the floating gate 109 is about 2 V, and thus becomes the writing level.

Figure 3:
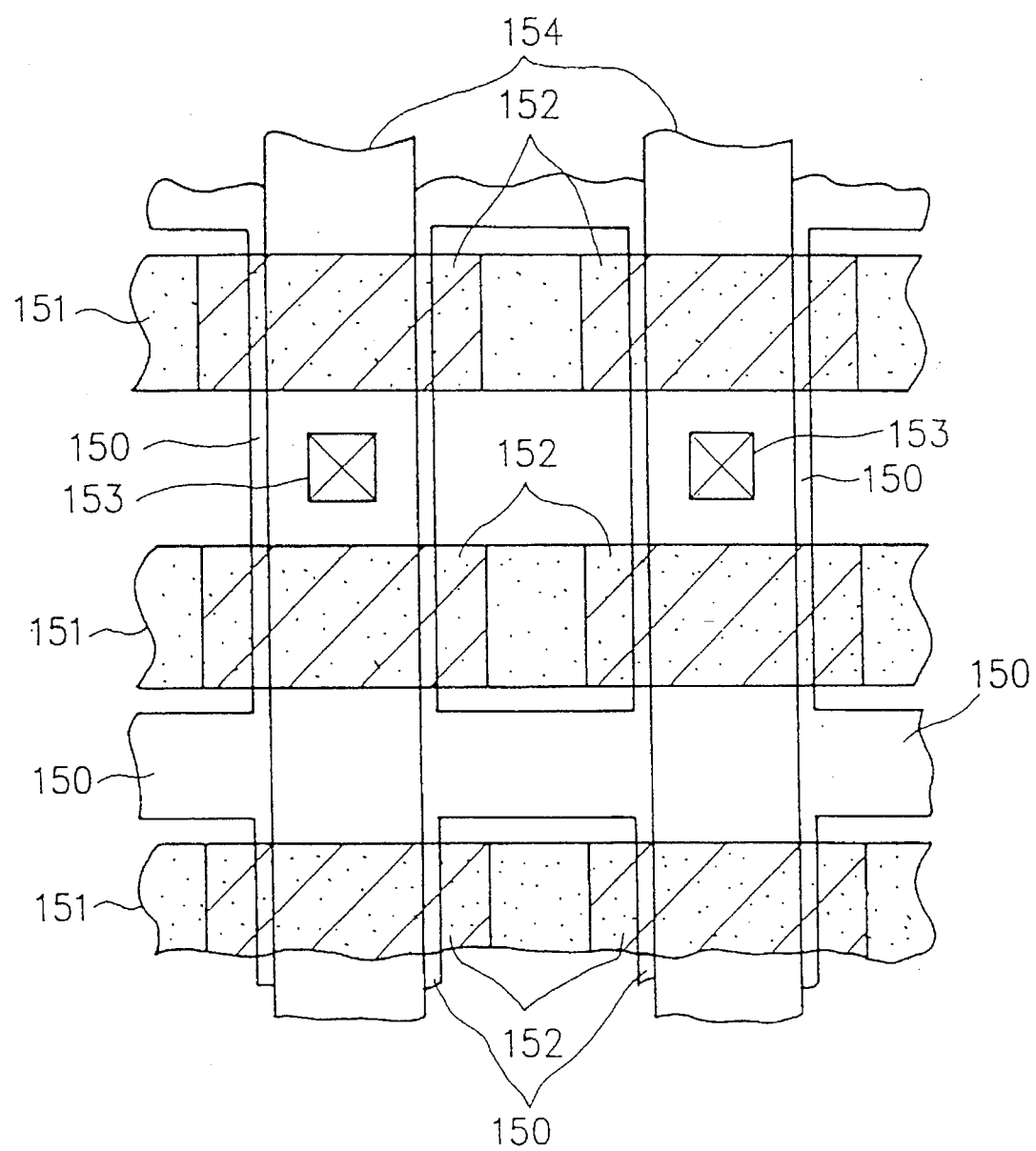
FIG. 3 is a schematic plan view showing a structure of the EEPROM memory cells corresponding to the part shown in FIG. 2.

FIG. 3 is a plan view showing a structure of the memory cells of the present embodiment. In the figure, the reference numeral 150 designates an N-type impurity diffusion layer (the drain and source of the memory cell, and the source line), the reference numeral 151 designates a word line (that is, the control gate), the reference numeral 152 designates a floating gate, the reference numeral 154 designates a bit line, and the reference numeral 153 designates a contact hole. In the present embodiment, the occupation area of the memory cell for 1 bit is about 10 μm$^2$.

Next, the description will hereinbelow be given with respect to a method of manufacturing the nonvolatile semiconductor memory of the present embodiment, which has the above-mentioned structure, with reference to FIGS. 5A to 5C and FIGS. 6A to 6D.

Firstly, as shown in FIG. 5A, after phosphorus ions have been implanted into the P-type silicon substrate 105 with a dose of $1\times10^{12}$ to $10^{13}$ cm$^{-2}$ by the ion implantation method, the heat treatment is performed to form the N-type well 112. Thereafter, a silicon oxide film 115 with a thickness of about 400 Å is formed by the thermal oxidation process.

Next, as shown in FIG. 5B, a photoresist 117 which has an opening corresponding to the inner portion of the N-type well 112 is formed by the photolithography technique. Then, boron ions are implanted into the N-type well 112 with a dose of $1\times10^{13}$ to $10^{14}$ cm$^{-2}$ with the photoresist 117 as a mask.

Next, as shown in FIG. 5C, the heat treatment is performed to form the P-type well 113 in the N-type well 112.

Figure 6A:
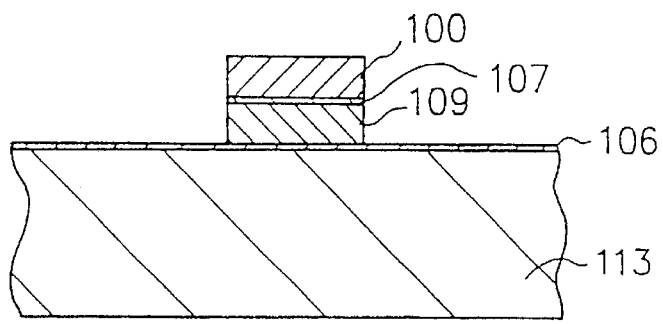
FIG. 6A is a cross sectional view useful in explaining a first step in an example of a method of forming a source and a drain, which are formed in the well, of the semiconductor memory of the present invention.

Thereafter, as shown in FIG. 6A, the silicon oxide film 106 with a thickness of about 10 nm is formed on the surface of the P-type well 113 by the thermal oxidation, and then a conductive polycrystalline silicon film with a thickness of about 150 nm is formed on the silicon oxide film 106. Then, the conductive polycrystalline silicon film is subjected to the patterning by the photolithography technique to be divided in correspondence to the arrangement of the memory cells. Next, an insulating film with a thickness of about 25 nm which is made up of an oxide film and a nitride film is formed all over the surface of the substrate body, and then a conductive polycrystalline silicon film with a thickness of about 250 nm is formed all over the surface of the insulating film. Next, the insulating film and the upper and lower conductive polycrystalline silicon films sandwiching the insulating film therebetween are subjected to the patterning by the photolithography technique and the RIE (reactive ion etching) technique, thereby to form the floating gate 109, the insulating film 107 and the control gate 100 in a self-alignment manner.

Figure 6B:
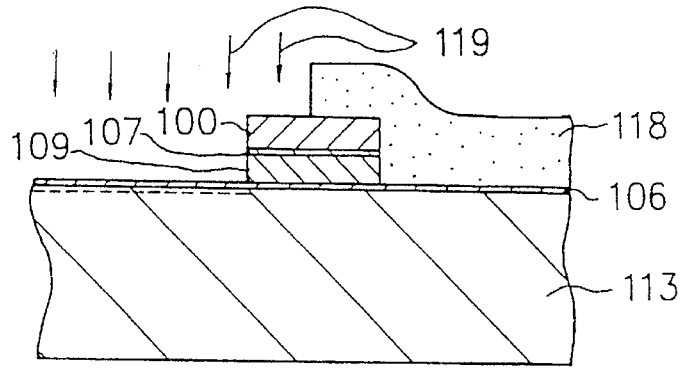
FIG. 6B is a cross sectional view useful in explaining a second step in an example of a method of forming a source and a drain, which are formed in the well, of the semiconductor memory of the present invention.

Next, as shown in FIG. 6B, a photoresist 118 which has an opening corresponding to a part, in which the source is to be formed, and a part of the control gate 100, is formed on the substrate body by the photolithography technique, and then BF$_2$ ions are implanted into the P-type well 113 with a dose of $1\times10^{13}$ to $2\times10^{14}$ cm$^{-2}$ with both the photoresist 118 and the control gate 100 as a mask by the ion implantation method.

Figure 6C:
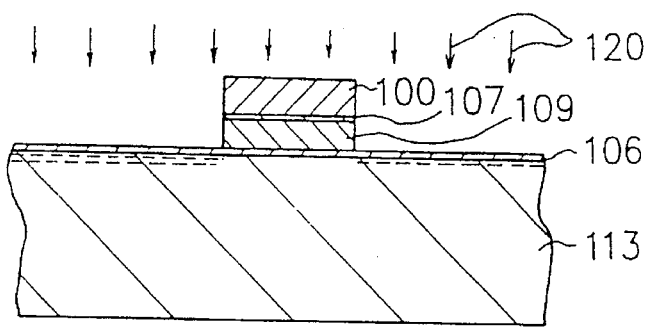
FIG. 6C is a cross sectional view useful in explaining a third step in an example of a method of forming a source and a drain, which are formed in the well, of the semiconductor memory of the present invention.

Next, as shown in FIG. 6C, after the photoresist 118 has been removed, arsenic ions are implanted into all the surface of an active region of the P-type well 113 with a dose of $1\times10^{15}$ to $10^{16}$ cm$^{-2}$ by the ion implantation method.

Figure 6D:
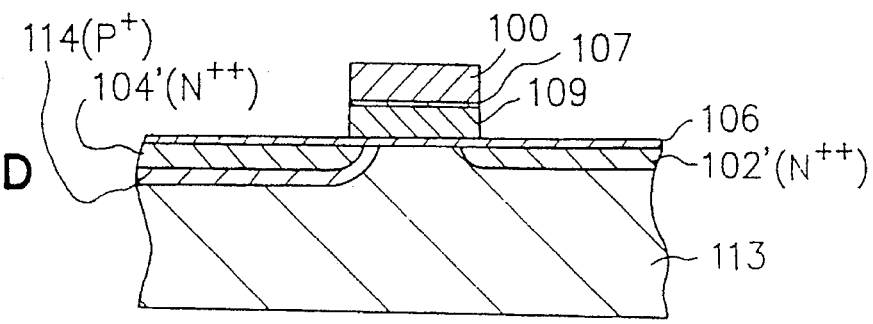
FIG. 6D is a cross sectional view useful in explaining a fourth step in an example of a method of forming a source and a drain, which are formed in the well, of the semiconductor memory of the present invention.

Then, as shown in FIG. 6D, the heat treatment is performed at a temperature of 950° C. for 30 minutes in nitrogen ambient, whereby the boron ions and the arsenic ions which have been implanted into the P-type well 113 are thermally diffused to form the drain 102', the source 104' and the high impurity concentrated P-type diffusion layer 114, respectively.

By performing the process shown in FIGS. 6A to 6D, the structure can be formed in which the source 104' is enclosed with the P-type impurity diffusion layer 114 the impurity concentration of which is higher than that of the P-type well 113.

Incidentally, the isolation region shown in FIG. 4 is previously formed by the LOCOS (Local Oxidation of Silicon) method or the like before carrying out the process shown in FIGS. 6A to 6D. In addition, the high impurity concentrated P-type diffusion layer 301 and the high impurity concentrated N-type diffusion layer 302 may be formed simultaneously at the time of forming the impurity diffusion layer of the P conductivity type and the impurity diffusion layer of the N conductivity type in the process shown in FIGS. 6A to 6D, respectively, or may be formed in the different process.

Next, the description will hereinbelow be given with respect to a method of rewriting the data to the memory cell of the present embodiment with reference to FIGS. 7 to 10.

Figure 7:
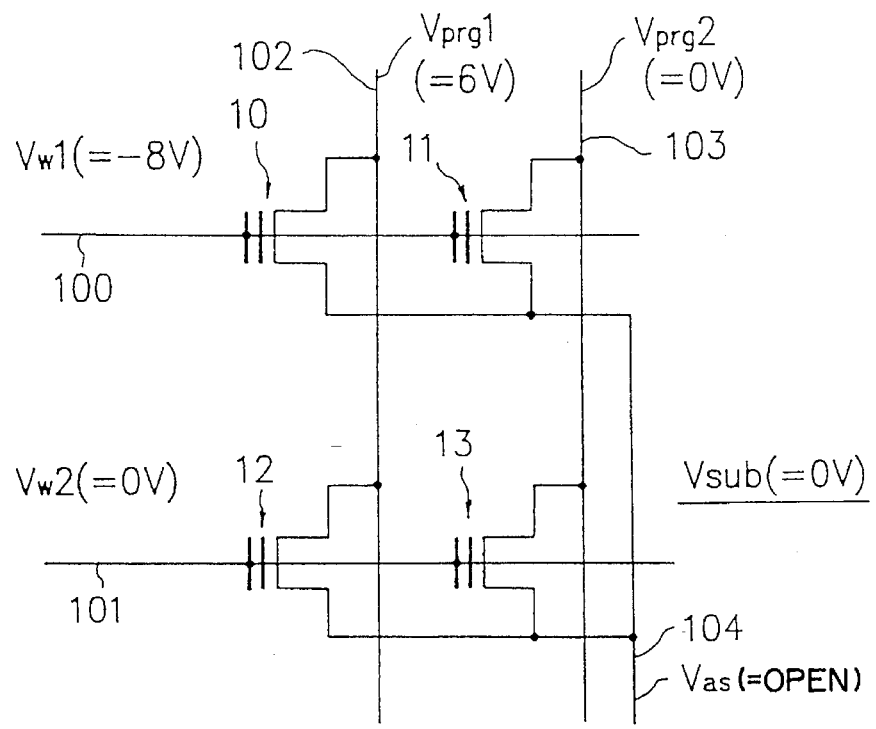
FIG. 7 is a circuit diagram useful in explaining the combination of the applied voltages when data is written to the memory cell of FIG. 2.

FIG. 7 is a circuit diagram useful in explaining the combination of the applied voltages when the data is written to the memory cell 10.

In the case where the data is written to the memory cell 10, as shown in the figure, when the voltage for the word line 100 is assumed to be Vw1, for example, Vw1=−8 V is applied to the word line 100. In addition, when the voltage for the bit line 102 is assumed to be Vprg1, for example, Vprg1=6 V is applied to the bit line 102. Further, when the voltage for the P-type well 113 constituting the substrate portion is assumed to be Vsub, for example, Vsub=0 V is applied to the P-type well 113. Further, when the voltage for the source line 104 is assumed to be Vas, the source line 104 is released. The voltage relationship at that time, since the negative voltage is applied to the time is expressed by Vprg1>Vsub≈0 V>Vw1. At this control gate 100, the memory cells 10 and 11 are in the off state and thus no channel is formed in the memory cells 10 and 11. If the above-mentioned voltage relationship is applied to the expression (1) and the coupling ratio Rp is assumed to be 0.6, the potential difference between the floating gate 109 and the drain 102' of FIG. 1 becomes about 10.5 V. Then, due to the potential difference therebetween, the F-N tunnel current is caused to flow, and thus the electrons are extracted from the floating gate 109 into the drain 102'. At this time, the memory cell 10 to which the data is to be written is at the erasing level and the threshold voltage thereof is lowered by extracting the electrons from the floating gate 109. Then, the writing time and the like are suitably controlled so as not to excessively lower that threshold voltage, whereby the threshold voltage can be set to 2 V as the writing level.

As shown in FIG. 7, in the case where the data is written to the memory cell 10, when the voltage for the word line 101 is assumed to be Vw2, for example, Vw2=0 V (Vw2>Vw1) is applied to the word line 101. In addition, when the voltage for the bit line 103 is assumed to be Vprg2, for example, Vprg2=0 V is applied to the bit line 103. At this time, the potential difference between the control gate and the drain of the memory cell 11 becomes 8 V, and as a result, the voltage of about 7 V is induced in the floating gate of the memory cell 11. However, the potential difference due to that induced voltage is insufficient to cause the flow of F-N tunnel current. Therefore, the threshold voltage of the memory cell 11 is not changed. In other words, the writing of the data to the memory cell 11 is not performed. In addition, the potential difference between the control gate and the drain of the memory cell 12 becomes 6 V, and as a result, the potential difference of about 5.5 V is caused between the floating gate and the drain of the memory cell 12. However, of course, this potential difference is insufficient to cause the flow of the F-N tunnel current. Therefore, the threshold voltage of the memory cell 12 is also not changed. In other words, the writing of the data to the memory cell 12 is also not performed.

Next, the erasing operation will hereinbelow be described.

Figure 8:
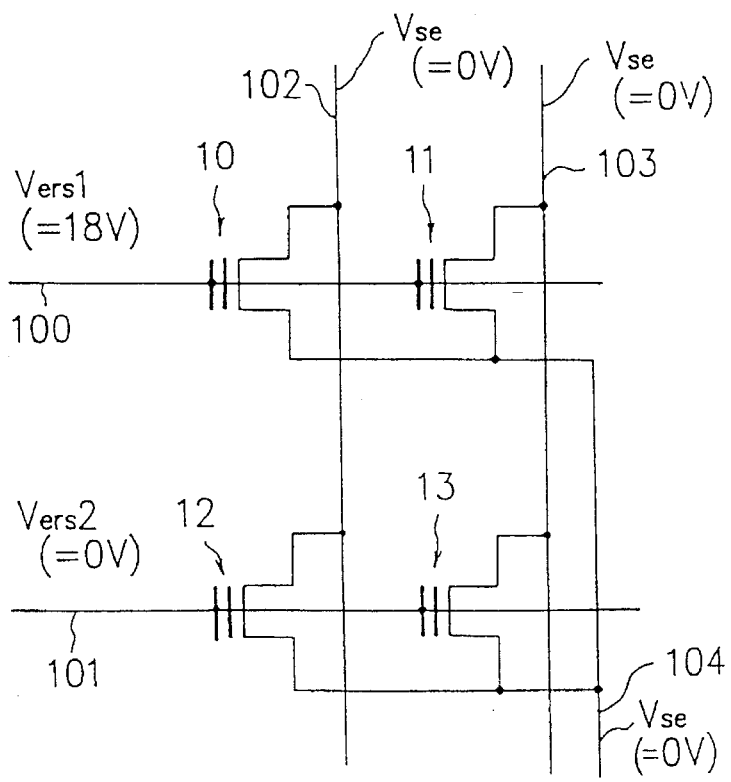
FIG. 8 is a circuit diagram useful in explaining the combination of the applied voltages in a first example of a method of erasing data stored in the memory cell of FIG. 2.

FIG. 8 is a circuit diagram showing a first example of the combination of the applied voltages when the data stored in the memory cell 10 is erased.

In this first example of the erasing method, when the voltage for the word line 100 is assumed to be Vers1, for example, Vers1=18 V is applied to the word line 100. In addition, when the voltage for the bit lines 102 and 103, and the source line 104 is assumed to be Vse, for example, Vse=0 V (Vers1>>Vse) is applied to the bit lines 102 and 103, and the source line 104. At this time, since the high voltage of 18 V is applied to the control gate 100 of the memory cell 10, the memory cell 10 is turned on so that the channel is formed in the memory cell 10. Then, the potential difference between the control gate 100 and the channel of the memory cell 10 becomes 18 V. Therefore, if the coupling ratio Rp is assumed to be 0.6, the voltage of about 11 V is induced in the floating gate 109 of the memory cell 10. Then, due to the potential difference between the floating gate 109 and the channel of the memory cell 10 caused by this induced voltage, the F-N tunnel current is caused to flow so that the electrons are injected from the channel region into the floating gate 109. As a result, the threshold voltage of the memory cell 10 is elevated up to 6 to 8 V for example, and thus the memory cell 10 becomes at the erasing level. At this time, since the voltage applied to the word line 101 is 0 V, the threshold voltages of the memory cells 12 and 13 are not changed. Therefore, the data stored in the memory cells 12 and 13 is not erased. However, since the same voltage as that applied to the memory cell 10 is applied to the memory cell 11, the data stored in the memory cell 11 is erased. That is, according to the first example of the erasing method, in the same manner as in the prior art EEPROM, the data stored in all the memory cells on the same word line as that of the selected memory cell is erased.

Figure 9:
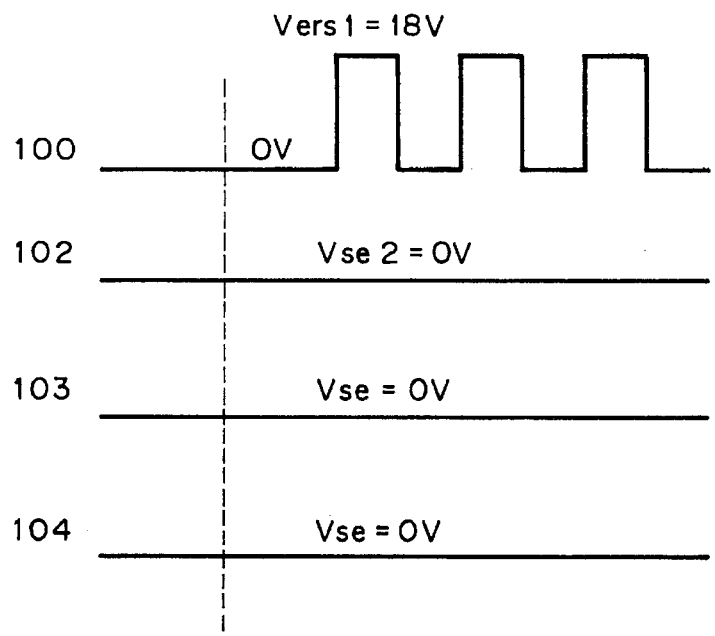
FIG. 9 shows a relationship between waveforms at several points in the circuit of FIG. 8.

FIG. 9 shows the relationship among the waveforms at the control gate 100, the bit lines 102 and 103, and the source line 104.

Figure 10:
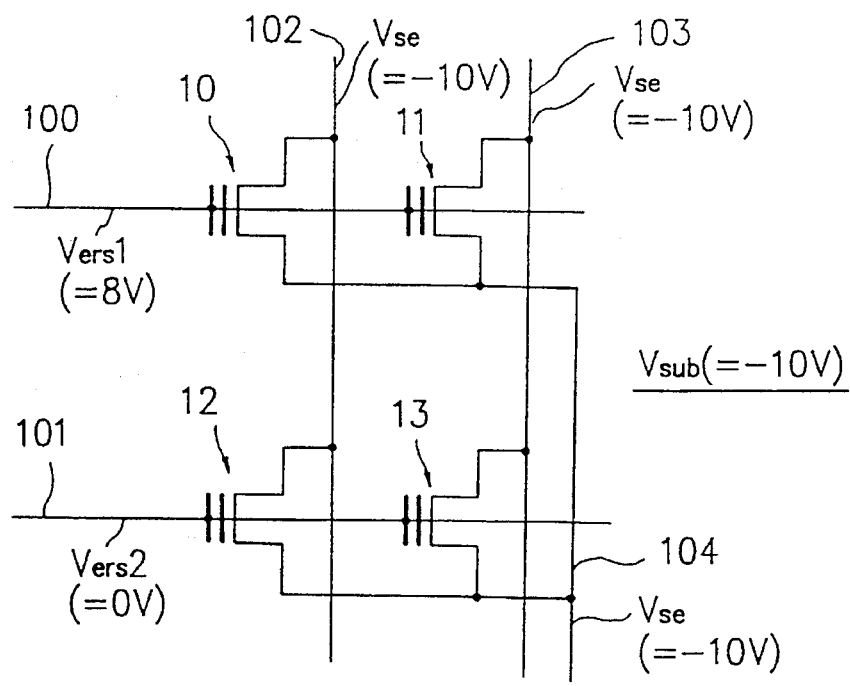
FIG. 10 is a circuit diagram useful in explaining the combination of the applied voltages in a second example of a method of erasing data stored in the memory cell of FIG. 2.

FIG. 10 is a circuit diagram showing a second example of the combination of the applied voltages when the data stored in the memory cell 10 is erased.

In the second example of the erasing method, to the word line 100 is applied Vers1=8 V for example, and to the bit lines 102 and 103 and to the source line 104 is applied Vse=−10 V (Verstl>0 V>Vse) for example. At this time, since the voltage of 8 V is applied to the control gate 100 of the memory cell 10, the memory cell 10 is turned on, and thus the channel is formed in the memory cell 10. Incidentally, in the present example, the electric potential Vsub at the P-type well 113 constituting the semiconductor substrate portion is set to the same value as the voltage Vse. In the case of the present example, since the potential difference between the control gate 100 and the channel of the memory cell 10 is 18 V, in the same manner as in the above-mentioned first example of the erasing method, the F-N tunnel current is caused to flow so that the electrons are injected from the channel region into the floating gate 109. As a result, the threshold voltage of the memory cell 10 is elevated and thus the memory cell 10 becomes at the erasing level. In addition, when the voltage applied to the word line 101 is assumed to be Vers2, for example, Vers2=0 V is applied thereto, whereby the potential difference of 8 V is caused between the control gates and the drains/sources/substrate of the memory cells 12 and 13. As a result, the potential difference of about 6 V is induced between the floating gates and the drains/sources/substrate of the memory cells 12 and 13. However, this induced potential difference is insufficient to cause the flow of the F-N tunnel current. Therefore, the data stored in the memory cells 12 and 13 is not erased. Incidentally, in the same manner as in the above-mentioned first example of the erasing method, in this second example of the erasing method as well, the data stored in all the memory cells (for example, the memory cell 11) on the same word line as that of the selected memory cell is erased.

FIG. 11 shows the relationship among the waveforms at the same points in the circuit as in FIG. 9.

Figure 15:
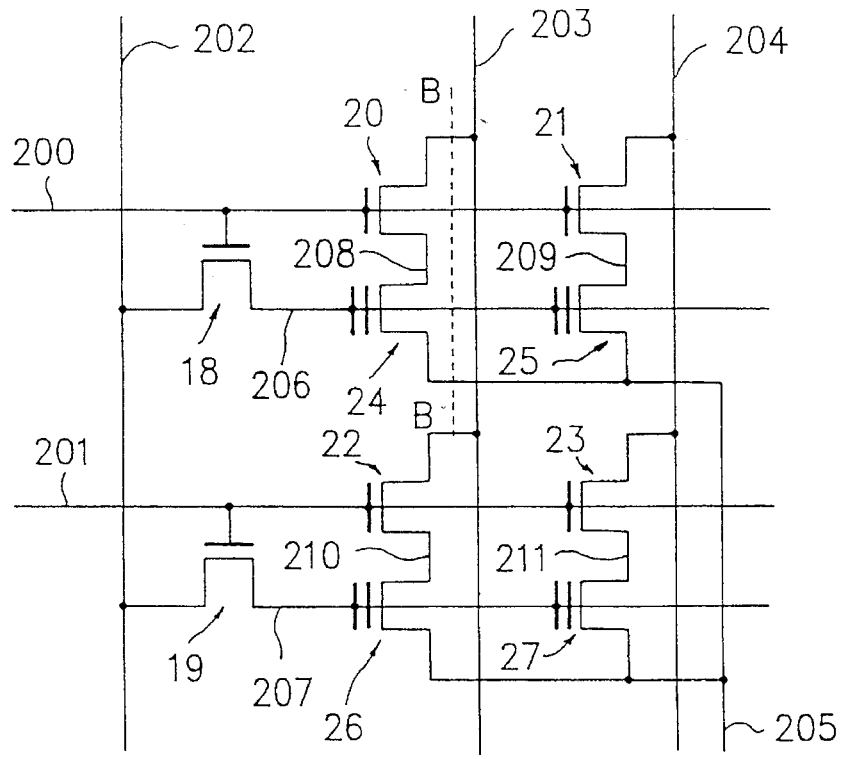
FIG. 15 is a circuit diagram showing the electrical connection of the prior art EEPROM memory cells.
Figure 16:
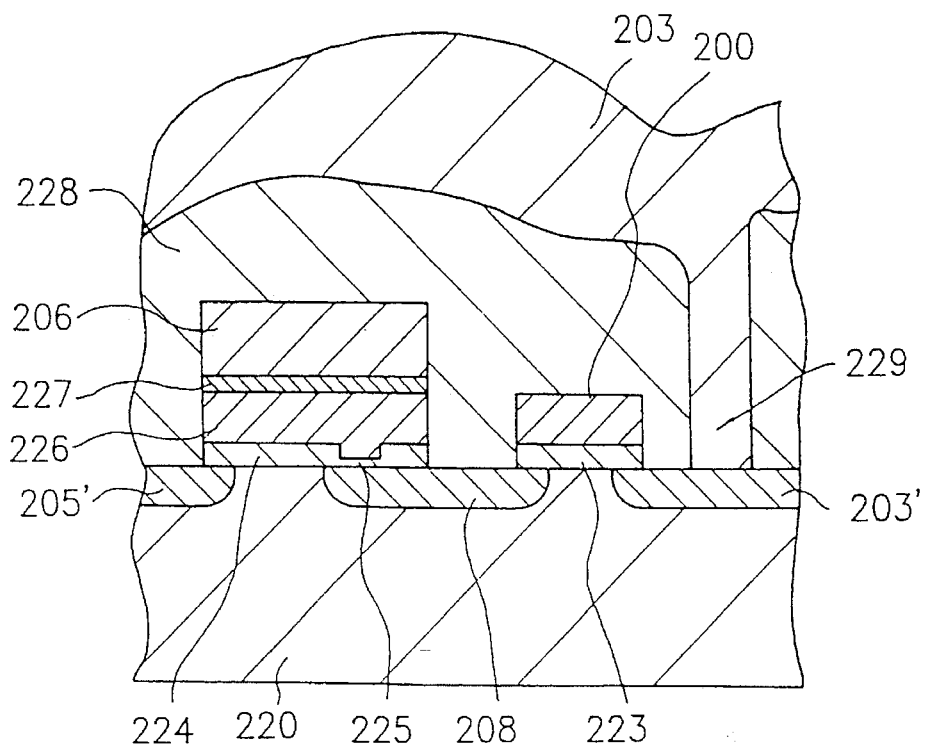
FIG. 16 is a schematic vertical cross sectional view taken along the line B—B of FIG. 15.
Figure 17:
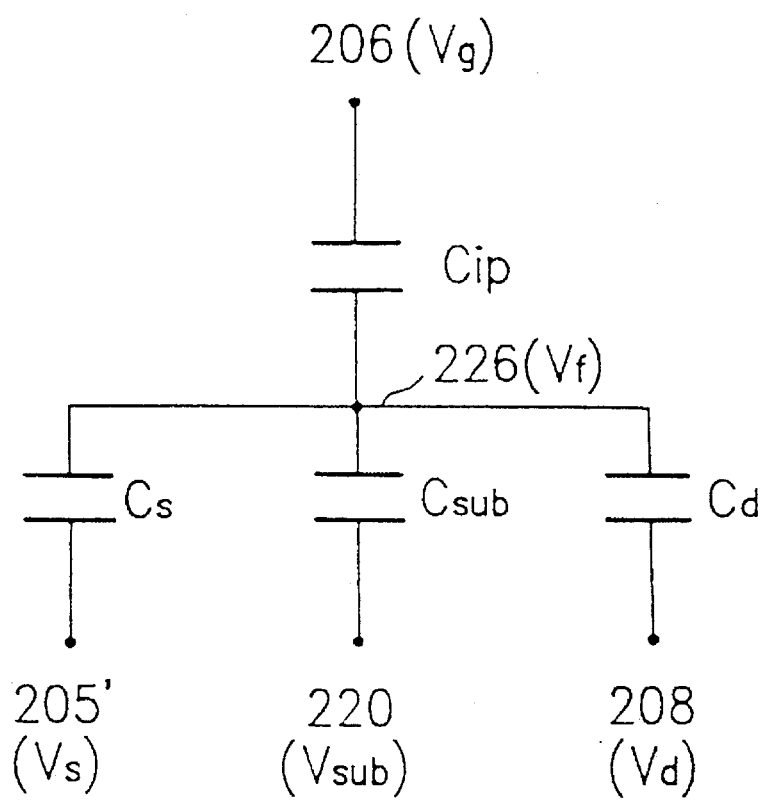
FIG. 17 is a circuit diagram showing an equivalent circuit of the memory cell of FIG. 16.

In the method of rewriting the data to the memory cell using the two examples of the erasing method as described above, the tunnel phenomenon is utilized for either the writing or erasing operation, and also no separating MOS transistor is required. Therefore, as compared with the first prior art example shown in FIGS. 15 and 16, the large reduction of the area of the cell array can be realized, and in its turn, the promotion of the large scale integration of the cell array can be attained. In addition, since the CHE injection is not utilized for the writing operation, as compared with the second prior art example shown in FIGS. 18 and 19, the voltage applied to the drain of the memory cell in the reading operation can be increased (for example, this applied voltage is at the most 1 V in the prior art, whereas it can be made equal to or higher than 2 V in the present embodiment). As a result, the on current of the memory cell in the reading operation can be made large, and also the reading speed in the reading operation can be increased. In addition, since the F-N tunnel current is utilized for either the writing or erasing operation, the MOS semiconductor memory can be operated by using the reduced single power source voltage.

Further, in the present embodiment, the erasing of the data in the memory cell is the operation in which the threshold voltage of that memory cell is increased. Therefore, there is also provided the advantage that the problem of the excessive erasing in the erasing operation does not arise. That is, in the second prior art example shown in FIGS. 18 and 19, in the case where the data in the cell array is collectively erased, the excessive erasing due to the dispersion in the characteristics, which was generated when manufacturing the memory cells (that is, the phenomenon in which the threshold voltage is excessively lowered) becomes a problem. Then, in order to prevent this phenomenon, it is required that the erasing work is performed in a time sharing manner, and the verifying operation is performed in the middle of the erasing work. As a result, in the prior art example, the time required for the data to be erased is increased (for example, in the case of the integration of 1M bits, the erasing time of about 900 ms is required). On the other hand, in the above-mentioned embodiment of the present invention, even in the case where the data stored in the cell array is collectively erased, such an operation can be performed within 20 ms.

In addition, in the above-mentioned embodiment of the present invention, as shown in FIGS. 1 and 4, the nonvolatile MOS semiconductor memory is designed in such a way that each of the memory cells is formed in the P-type well 113 which is electrically isolated from the P-type silicon substrate 105 through the N-type well 112, and also the electric potentials at the P-type well 113 and the N-type well 112 can be set independently of each other. Therefore, the electric potential at the P-type well 113 as the substrate potential in the rewriting of the data to the memory cell can be set relatively freely. Thus, for example, as in the above-mentioned second example of the erasing method, the voltage lower than the ground potential is applied to the P-type well 113, whereby the high voltage (Vers1) applied to the control gate can be relatively lowered. As a result, there is provided the advantage that the transistor breakdown voltage in the peripheral circuit for controlling the high voltage (Vers1) can be designed to be low. In particular, since the width of the isolation region (the field portion) to which the high voltage (Vers1) is applied can be made narrow, it is possible to realize EEPROM having the higher integration.

FIG. 12 is a circuit diagram useful in explaining a third example of the combination of the applied voltages when the data stored in the memory cell 10 of FIG. 2 is erased.

In this third example of the erasing method, to the word line 100 is applied Vers1=12 V for example. When the voltage for the source line 104 is assumed to be Vse1, for example, Vse1=5 V is applied thereto and when the voltage for the bit line 102 is assumed to be Vse, for example, Vse=0 V is applied thereto. That is, the relationship of Vers1>Vse1>Vse2>0 V is established. At this time, 12 V, 5 V and 0 V are applied to the control gate, the source and the drain of the memory cell 10, respectively. Therefore, the hot electrons are generated in the vicinity of the source of the memory cell 10, and the CHE injection due to the hot electrons is caused so that the threshold voltage of the memory cell 10 is increased. On the other hand, when to the word line 101 is applied Vers2=0 V (Vers1>Vers2) for example, in the memory cell 12, the control gate is at 0 V, the drain is at 0 V, and the source is at 5 V. Thus, the memory cell 12 is kept in the off state, and the threshold voltage thereof is not changed. Moreover, at this time, when the voltage for the bit line 103 is assumed to be Vse3, if Vse3=5 V (Vse3≈Vse1>Vse2) is applied thereto, the control gate, the drain and the source of the memory cell 11 become at 12 V, 5 V and 5 V, respectively. Thus, since the voltage at the control gate is 12 V, the memory cell 11 is turned on so that the channel is formed in the memory cell 11. However, since there is substantially no potential difference between the drain and source of the memory cell 11, no channel current is caused to flow, and therefore, no CHE injection is also caused. In addition, since the potential difference is small, no F-N tunnel current is also caused to flow. Therefore, the threshold voltage of the memory cell 11 is not changed. Further, 0 V, 5 V and 5 V are applied to the control gate, the drain and the source of the memory cell 13, respectively. However, the memory cell 13 is in the off state because the voltage at the control gate thereof is 0 V. In addition, since the potential difference is also small, the threshold voltage of the memory cell 13 is also not changed.

Figure 13:
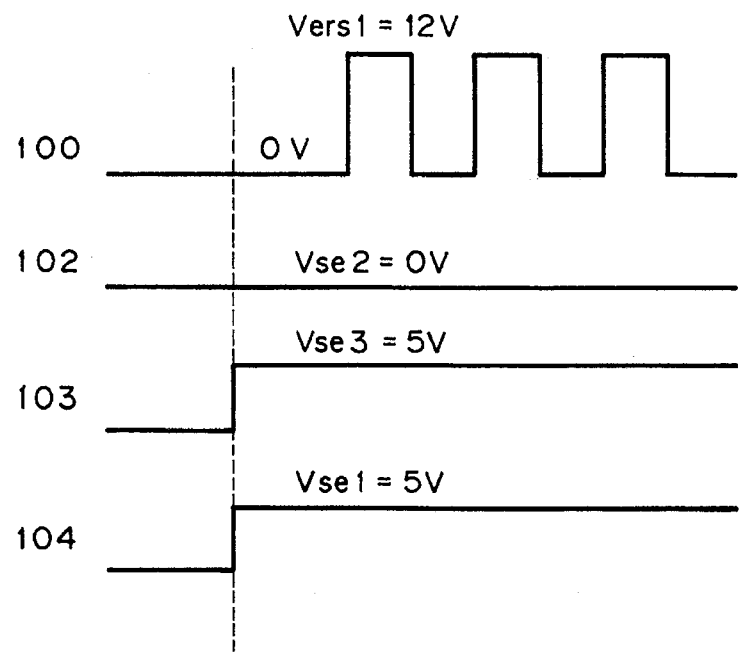
FIG. 13 shows a relationship between waveforms at several points in the circuit of FIG. 12.
Figure 14:
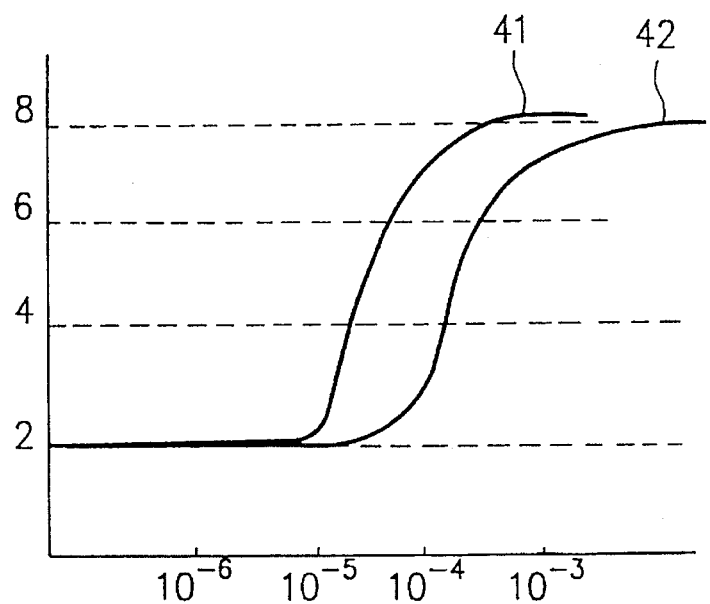
FIG. 14 is a graphical representation showing the erasing characteristics in the third example of a method of erasing the data stored in the memory cell on the basis of the existence and non-existence of a high impurity concentrated P-type diffusion layer enclosing the source of the memory cell of FIG. 1.

FIG. 13 shows the relationship among the waveforms at the same points in the circuit as shown in FIG. 9.

Figure 18:
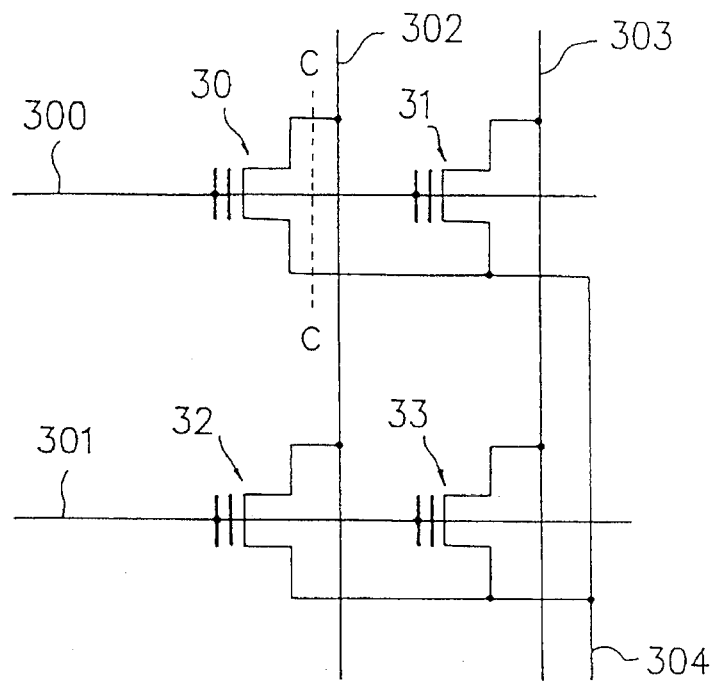
FIG. 18 is a circuit diagram showing the electrical connection of the prior art another EEPROM memory cells.
Figure 19:
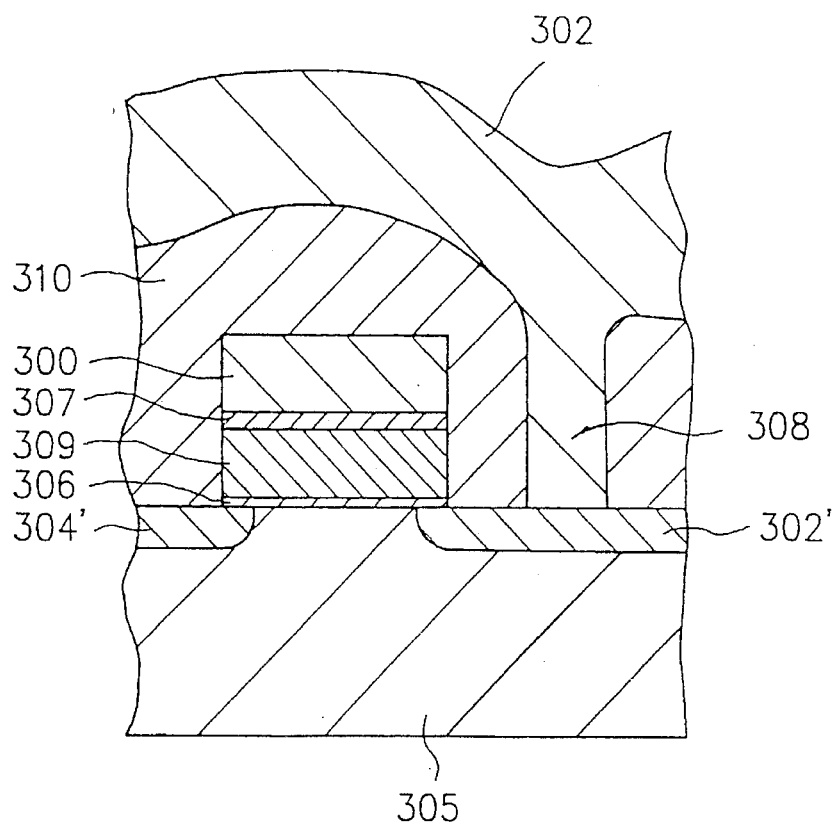
FIG. 19 is a schematic vertical cross sectional view taken along the line C—C of FIG. 18.

In the third example of the erasing method, since the F-N tunnel current is utilized in the writing operation, and the CHE injection from the source to the floating gate is utilized in the erasing operation, as compared with the second prior art example shown in FIGS. 18 and 19, the following advantages are provided.

One advantage of the third example of the erasing method is as follows. In the prior art, in the erasing operation, the selection and erasing of the data can be performed only in bytes (or, in words or sectors), whereas in the third example of the erasing method, as described above, the data can be erased in bits. In addition, in the prior art, in order to erase the data in bytes (or, in words or sectors), the MOS transistor for selecting the byte (or, the word or sector) needs to be prepared separately from the cell array, or the source line needs to be separated in bytes (or, in words or sectors), whereas in the third example of the erasing method, without adopting such measures, the data can be erased in bits. Therefore, the data in the unnecessary memory cells is definitely not erased, and also the area occupied by the device can be reduced.

Further, in the case where the data stored in the memory cell is read out, in the same manner as in the second prior art example shown in FIGS. 18 and 19, the fixed voltage is applied to the drain of the selected memory cell and the source thereof is grounded, thereby to read out the data from the selected memory cell, whereas in the third example of the erasing method, since the CHE injection is performed from the source, the possibility of the malerasing (the malwriting in the prior art example) due to the voltage at the drain is reduced. Therefore, there is provided the advantage that the drain voltage in the reading operation can be set to a high value as compared with the prior art example, and also the reading speed can be increased. Moreover, there is provided the advantage that since the drain voltage in the reading operation and the source voltage in the erasing operation are independent of each other, the promotion of reduction of the voltage during the CHE injection can be readily attained.

In addition, as shown in FIGS. 1 and 4, the memory cell of the present embodiment has the structure in which the N-type impurity diffusion layer 104' constituting the source is enclosed with the P-type impurity diffusion layer 114 the impurity concentration of which is higher than that of the P-type well 113. Therefore, the efficiency of generation of the hot electrons in the vicinity of the source is greatly improved as compared with the case where no P-type impurity diffusion layer 114 is provided. FIG. 11 is a graphical representation showing the erasing characteristics in the case where the data stored in the memory cell is erased in accordance with the third example of the erasing method, with respect to both the case of the provision of the P-type impurity diffusion layer 114 (represented by a curve 41) and the case of no provision of the P-type impurity diffusion layer 114 (represented by a curve 42). As can be seen from this graph, by the provision of the P-type impurity diffusion layer 114, the figure of the erasing speed is increased by about one place.

Incidentally, as the method of erasing the data in the memory cell according to the present invention, a method may be adopted in which the above-mentioned first example of the erasing method is combined with the above-mentioned third example of the erasing method, or the above-mentioned second example of the erasing method is combined with the above-mentioned third example of the erasing method. For example, in the case of the latter, when the data in the memory cell needs to be erased in bits, the third example of the erasing method is employed, while when the data in the memory cell needs to be erased in sectors or larger units (that is, in blocks or all the memory cells of EEPROM), the second example of the erasing method is employed. That is, in the application in which a plurality of bytes (in the range of several hundreds of bytes to several M bytes) want to be simultaneously erased, in the third example of the erasing method, in terms of the saving in the power consumption required for the erasing operation, a little quantity of time (for example, about 1.3 seconds in 128 k bytes) is required, whereas by adopting, together with the second example of the erasing method, the third example of the erasing method, the erasing operation can be performed within about 20 ms.

Although the preferred embodiments of the present invention have been described, the description is not intended to be construed in a limiting sense, and thus the present invention is not limited to the above-mentioned embodiments. For example, in the method of rewriting the data to the memory cell in the above-mentioned embodiments, the concrete voltage values have been shown. However, it should be noted that those voltage values should be suitably changed within the scope fulfilling the relation mentioned in Claims in accordance with the structure of the memory cell, in particular, the capacitance values of the oxide films and the interlayer insulating film and the value of the coupling ratio.

In addition, the double well structure as in the above-mentioned embodiments is not necessarily adopted. That is, it is to be understood that the memory cells may be directly formed in the P-type silicon substrate 105.

Further, in the case where the third example of the erasing method is not employed, the P-type impurity diffusion layer 114 may not be especially provided.

As set forth hereinabove, according to the present invention, the impurity diffusion layer constituting the source of each of the memory cells such as EEPROM contacts the high impurity concentrated diffusion layer which has the same conductivity type as that of the semiconductor substrate portion and the impurity concentration of which is higher than that of the semiconductor substrate portion. Therefore, in the case where the hot electrons are injected into the electric charge holding layer of the memory cell, thereby to erase the data stored in that memory cell, the efficiency of generation of the hot electrons in the vicinity of the source of that memory cell can be effectively improved.

In addition, according to the present invention, each of the memory cells such as EEPROM is formed in the first well which has the same conductivity type as that of the semiconductor substrate and is formed so as to float in the second well of the same conductivity type as that of the semiconductor substrate, and also the electrical connections to the first and second wells are performed independently of each other. Therefore, the substrate potential when rewriting the data to the memory cell, that is, the electric potential at the first well can be relatively arbitrarily set.

Further, according to the method of rewriting the data to the memory cell of the present invention, the rewriting and reading operations can be performed with the single power source voltage, and also the reduction of the power source voltage can be readily performed. In addition, since no separating transistor is required, the reduction of the cell area can be performed, and thus it is possible to improve the integration of the nonvolatile semiconductor memory.

We claim:

1. A method of writing and erasing data in a nonvolatile semiconductor memory device having a plurality of memory cells arranged in a matrix, said plurality of memory cells being formed in a first well of a first conductivity type, said first well being formed in a second well of a second conductivity type which is formed in a semiconductor substrate of said first conductivity type, wherein each of said memory cells further includes a source which comprises (a) a first high impurity concentrated diffusion layer of said first conductivity type being formed in said first well, and (b) a second high impurity concentrated diffusion layer of said second conductivity type being formed in said first high impurity concentrated diffusion layer, said first high impurity concentrated diffusion layer having impurities of said first conductivity type with a higher concentration than said semiconductor substrate and said second high impurity concentrated diffusion layer having impurities of said second conductivity type with a higher concentration than said second well, a drain which comprises a third high impurity concentrated diffusion layer of said second conductivity type being formed in said first well, said third high impurity concentrated diffusion layer having impurities of said second conductivity type with a higher concentration than said second well a channel region between said source and drain, an electric, charge holding layer disposed above said channel region, a control gate disposed above said channel region, said method comprising the steps of:

selecting a first memory cell from said plurality of memory cells;

applying a first voltage lower than a ground potential to a control gate of said first memory cell;

applying a second voltage higher than the ground potential to a drain of said first memory cell;

opening a source of said first memory cell to let it float;

maintaining said first and second voltages until a potential of said first memory cell reaches a write level due to extraction of negative electric charges from an electric charge holding layer of said first memory cell by utilizing a tunnel phenomenon derived from a difference between said first and second voltages;

selecting at least one second memory cell from said plurality of memory cells having a control gate electrically communicating with said control gate of said first memory cell;

applying a third voltage to a drain of said at least one second memory cell, said third voltage being lower than said second voltage and not sufficient to derive the tunnel phenomenon from a difference of said third voltage and said first voltage;

selecting at least one third memory cell from said plurality of memory cells having a drain electrically communicating with said drain of said first memory cell;

applying a fourth voltage to a control gate of said at least one third memory cell, said fourth voltage being higher than said first voltage and not sufficient to derive the tunnel phenomenon from a difference of said fourth voltage and said second voltage, thereby information is written in said first memory cell, selecting a fourth memory cell from said plurality of memory cells;

applying a fifth voltage to a control gate of said fourth memory cell and the ground potential to a source and drain of said fourth memory cell so that a tunnel current flows due to a potential difference between an electric charge holding layer of said fourth memory cell and a channel region of said fourth memory cell, whereby electrons are injected to said electric charge holding layer of said fourth memory cell from said channel region of said fourth memory cell to have a potential of said fourth memory cell above an erasure level, thereby information written in said fourth memory cell is erased;

selecting a fifth memory cell from said plurality of memory cells; and applying a sixth voltage to a control gate of said fifth memory cell and a seventh voltage higher than the ground potential to a source of said fifth memory cell, whereby hot electrons are injected to an electric charge holding layer of said fifth memory cell from a channel region of said fifth memory cell to have a potential of said fifth memory cell above the erasure level, thereby information written in said fifth memory cell is erased.

* * * * *